United States Patent [19]

Krenik et al.

[11] Patent Number: 4,845,675
[45] Date of Patent: Jul. 4, 1989

[54] HIGH-SPEED DATA LATCH WITH ZERO DATA HOLD TIME

[75] Inventors: William R. Krenik, Dallas; Wei-Chan Hsu, Plano, both of Tex.

[73] Assignee: Texas Instruments Incorporated, Dallas, Tex.

[21] Appl. No.: 146,900

[22] Filed: Jan. 22, 1988

[51] Int. Cl.$^4$ .............................................. G11C 13/00
[52] U.S. Cl. .................................... 365/203; 365/190; 365/205; 307/530
[58] Field of Search .................... 365/73, 78, 203, 189, 365/190, 204, 205; 307/530

[56] References Cited

U.S. PATENT DOCUMENTS 4,740,926 4/1988 Takemae et al. .................... 365/203

Primary Examiner—Terrell W. Fears
Attorney, Agent, or Firm—B. Peter Barndt; Thomas W. Fitzgerald; Melvin Sharp

[57] ABSTRACT

A data latch with substantially zero hold time and with immunity to input data changes occurring after the latch has slewed toward a definable logic state. An input data flip-flop (10) is coupled via transfer transistors (40, 42) to an output data flip-flop (12). Output nodes (36,38) of the output data flip-flop (12) are prechargeable. Inhibit transistors (24,30) are cross-coupled between the input data flip-flop (10) and the output data flip-flop (12) to prevent input data changes from affecting the latch once the output data flip-flop (12) slews toward a definable stable state.

33 Claims, 1 Drawing Sheet

HIGH-SPEED DATA LATCH WITH ZERO DATA HOLD TIME

TECHNICAL FIELD OF THE INVENTION

The present invention relates in general to digital circuits, and more particularly to high-speed data latching circuits for temporarily storing digital information.

BACKGROUND OF THE INVENTION

Digital processing circuits often require latches for temporarily storing digital signals when transferring such signals between circuits. Such applications include high-speed A/D and D/A converters, high-speed memories, such as RAMs, ROMs, EPROMs, etc., high-speed pipelined logic circuits, and other applications.

Data latches are generally clocked to assure that the data being transferred is reliably stored, and that a coordinated transfer is accomplished without loss of data. In order to ensure that a data latch reliably stores digital signals presented at its input, such digital signal must be held at the latch input for a specified period of time during the input clocking cycle. The state of the digital signal appearing at the input of the latch during the noted period of time can then be reliably latched or stored in a flip-flop circuit internal to the latch. The specified period of time is termed the "hold time". The data is clocked and stored in the latch during such hold time, and thereafter the data on the input line of the latch can be changed without affecting the data stored within the latch.

High-speed data operations are optimized by minimizing the data hold time of the latches. Thus, the faster the data can be latched and stored, the processing of other digital circuits can commence for preparing updated or new inputs to the latches. High-speed CMOS data latches are currently available which operate at speeds up to twenty MHz. Such a latch is disclosed in the article "A CMOS 8-bit High-Speed A/D Converter IC", IEEE JOURNAL OF SOLID-STATE CIRCUITS, Vol. SC-20, No. 3, p. 775, June, 1985. The disadvantage of such a latch circuit, however, is its extremely long hold time, thus limiting the speed with which the latch may be used with other circuits.

It can be seen that a need exists for an improved high-speed data latch with an extremely short data hold time so that such latch does not present a limitation when used with other high-speed circuits. An additional need exists for a memory sense amplifier data latch in which the hold time is so small that a single clock transition can be utilized to sense data on the data line as well as precharge the data line, thereby reducing the complexity of the clocking schemes in memory support circuits.

SUMMARY OF THE INVENTION

In accordance with the present invention, a high-speed latch is disclosed which reduces or substantially eliminates the shortcomings and disadvantages of latch circuits well known in the art. The latch of the present invention is characterized by substantially a zero hold time, such that data presented on the input of the latch can be changed substantially simultaneously with a latch clock signal which latches the input data within the latch. More particularly, the advantages of the latch can be utilized in sense amplifier circuits of memories, wherein the transition of a single clock signal can be employed to sense and latch the bit line data read from the memory while at the same time precharge the bit line.

In the preferred embodiment of the invention, the high-speed latch is of balanced symmetrical construction, including a standard input data flip-flop, an output prechargeable data flip-flop and transfer transistors connected there between for coupling data and latching the same in the output flip-flop. In addition, the latch of the invention includes an inhibit circuit for preventing different input data from changing the state of the output flip-flop, once the output flip-flop slews toward a definable logic state. Thus, in response to a latch clock signal, input data can be changed as soon as the output flip-flop slews toward the definable logic state.

In the preferred form of the invention, the inhibit circuit comprises a pair of transistors cross-coupled between the input and output flip-flops of the latch, to provide a positive feedback path as long as the input data remains unchanged. Once the output flip-flop slews to a definable state the feedback path is established. The feedback paths also include transistors responsive to input data, so that if such data changes, the feedback paths are broken and the state of the output flip-flop cannot change. The addition of the noted inhibit transistors can be accomplished economically and easily without requiring significant semiconductor wafer area of circuits utilizing such latches.

In another embodiment, the high-speed latch of the invention can be employed as a sense amplifier in a memory of the type utilizing prechargeable complementary bit lines. With such an arrangement, a single clock signal can serve as both the latch and precharge signal, thereby simplifying the clock system and making more efficient use of high-speed memory circuits.

BRIEF DESCRIPTION OF THE DRAWINGS

Further features and advantages will become more apparent from the following and more particular description of the preferred embodiment of the invention, as illustrated in the accompanying drawings in which like reference characters generally refer to the same parts or elements throughout the views, and in which.

DETAILED DESCRIPTION OF THE INVENTION

Figure 1:
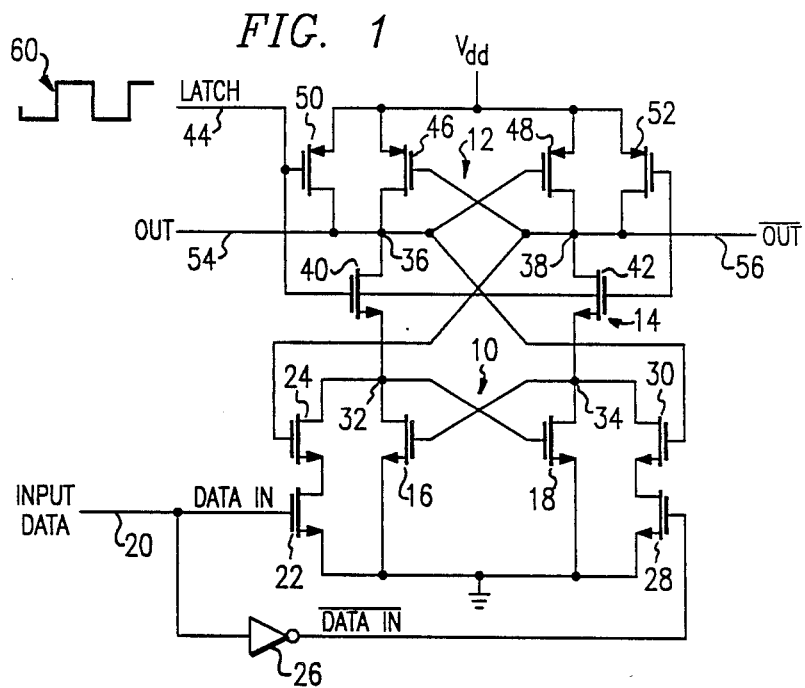
FIG. 1 is an electrical schematic drawing of the high-speed latch, constructed according to the preferred embodiment of the invention.

With reference to FIG. 1, there is illustrated the high-speed latch constructed in accordance with the preferred embodiment of the invention. The latch includes an input data flip-flop 10, an output data flip-flop 12 and a transfer circuit 14 for coupling signals from the input data flip-flop 10 to the output data flip-flop 12.

More specifically, the input data flip-flop 10 comprises a number of N-channel transistors, two transistors 16 and 18 of which comprise a cross-coupled flip-flop. Associated with the input data flip-flop 10 is a data input 20 which functions to coupled external data thereto. Preferably, the high-speed latch is constructed in a balanced manner, in which complementary data is coupled to the input data flip-flop 10. Hence, data appearing on the data input 20 is coupled as such via N-channel transistors 22 and 24 to the input data flip-flop 10.

The complementary signal of the data input 20 is inverted by inverter 26 and coupled via respective transistors 28 and 30 to the input data flip-flop 10. As can be seen from FIG. 1, transistors 22 and 24 are bridged in series across flip-flop transistor 16, while transistors 28 and 30 are bridged in series across flip-flop transistor 18. Transistor 22 is controlled by the input data, while transistor 28 is controlled by the complement of the input data. Furthermore, the gates of transistors 24 and 30 are connected in a cross-coupled manner, forming a positive feedback path, to the output data flip-flop 12. A ground forms a common return or rail for the input data flip-flop 10.

Nodes 32 and 34, which define the output nodes of the input data flip-flop 10, are connected to respective output nodes 36 and 38 of the output data flip-flop 12 via respective transfer transistors 40 and 42. Transfer transistors 40 and 42 are of the N-channel type which are controlled by a signal on a latch input 44.

In the preferred form of the invention, the output data flip-flop 12 is constructed with P-channel transistors. Transistors 46 and 48 of the output data flip-flop 12 are connected in a cross-coupled manner to function as a flip-flop. The flip-flop transistors 46 and 48 are each connected between a positive supply voltage $V_{dd}$ and the respective output nodes 36 and 38. Bridged across the flip-flop transistors 46 and 48 are respective precharge transistors 50 and 52. The gates of the precharged transistors 50 and 52 are also connected to the latch input 44, and are responsive to signals thereon for precharging the output nodes 36 and 38 substantially to the voltage $V_{dd}$. The output nodes 36 and 38 of the output data flip-flop 12 define a balanced and complementary output of the high-speed latch, as identified by reference numerals 54 and 56. The complementary outputs 54 and 56 of the high-speed data latch may be connected to other circuits through buffer or driver circuits (not shown).

The arrangement of the input data flip-flop 10, the output data flip-flop 12 and the transfer transistors of the transfer circuit 14 is rather conventional, as noted in the publication identified above. However, the understanding of the principles and concepts of the invention are best understood by presenting the entire operation of the high-speed data latch. In operation, the latch undergoes an initial precharge cycle in preparation of latching data therein. According to an important technical advantage of the invention, the data hold time of the latch is reduced substantially to a zero time period, defined by the condition in which a signal transition on the latch input 44 can function both as a precharge signal as well as the signal for inputting data into the latch. In practice, the hold time is less than about fifty picoseconds, which constitutes a portion of the clock signal rise time transition. Such a hold time is far less than that of data latches heretofore known.

The high-speed latch can be controlled by a single high-speed clock signal. For purposes of example, the clock signal on the latch input 44 is shown as a waveform having a 50% duty cycle. Because of the high-speed characteristics of the latch of the invention, such signal may control the latch operation upwardly at a rate of 200 MHz. During the logic low portion of the latch signal, precharge transistors 50 and 52 are driven into conduction, while transfer transistors 40 and 42 remain in a cutoff state. The conduction of precharge transistors 50 and 52 provides a path between the $V_{dd}$ supply voltage and the output nodes 36 and 38, whereby such nodes are precharged to logic high level. During the logic low period of the latch signal, flip-flop transistors 16 and 18 of the input data section discharge the output nodes 32 and 34 thereof toward the ground potential. Depending on the threshold voltage of input flip-flop transistors 16 and 18, the associated nodes 32 and 34 drop to a voltage near the ground potential. Also, during the logic low state of the latch signal, the high-speed flip-flop is nonresponsive to input data.

During the rising transition of the latch signal on the latch input 44, the precharge transistors 50 and 52 are driven into cutoff, while the transfer transistors 40 and 42 are driven into conduction. Hence, the input data flip-flop 10 is connected to the output data flip-flop 12, via respective nodes 32, 36 and 34, 38. During such rising transition of the latch signal, true data is coupled to transistor 22, and complement data is coupled to transistor 28. With nodes 36 and 38 precharged to logic high states, and during the rising transition of the latch signal, the data applied to the input data flip-flop 10 is prepared for transferral to the output data flip-flop 12.

Assuming, for purposes of example, that the data applied to the data input 20 is a logic high, transistor 22 will be driven into conduction, while transistor 28 will be cutoff. Associated series feedback transistors 24 and 30, due to their connection to the respective precharged output data flip-flop nodes 38 and 36, are both capable of conducting. As a result, with transistors 22 and 24 both conducting, node 32 will be essentially grounded, which potential is transferred through transistor 40 to thereby discharge the output data flip-flop node 36. On the other hand, since transistor 28 in rendered nonconductive by the complement of the input data signal, node 34 cannot be discharged, thus leaving output data flip-flop node 38 precharged to a logic high. Nodes 34 and 38 thus slew to a logic high state, while nodes 32 and 36 slew toward a logic low state. The output data flip-flop 12 then presents complementary signals on the outputs 54 and 56. As noted above, buffers can be connected to the outputs 54 and 56 to provide complementary logic signals, with states approaching the $V_{dd}$ and ground potentials.

It is important to realize that on the rising edge of the latch signal when data is presented to the input flip-flop 10, the nodes 36 and 38 of the output data flip-flop 12 begin slewing to definable states. During such slew transition, the inhibit transistors 24 and 30 are driven to respective opposite logic states. The opposite states of inhibit transistors 24 and 30, together with their serial connections to respective transistors 22 and 28, prevent a data change subsequent to the latch slew interval from affecting the logic state initially set into the output flip-flop 12.

For example, if data where to change on the data input 20 during the last part of the rising transition of the latch signal, as noted by reference numeral 60, such data change would not affect the initial state set into the output data flip-flop 12 during the slewing period. This is due primarily to the fact that at such point 60 in the latch signal transition, the data output flip-flop nodes 36 and 38 have slewed sufficiently in opposite directions to drive respective inhibit transistors 30 and 24 into opposite states of conduction. This situation then prevents an input data change, i.e., a logic low data state, on the data input 20 from changing the state initially set into the output data flip-flop 12.

In other words, if data on the data input 20 were to change from the high state to the low state during period 60 of the latch signal, transistor 22 would be driven into a state of nonconduction, while transistor 28 would be driven into a state of conduction. In this condition, inhibit transistor 24 would still be on, inhibit transistor 30 would be off, while transistor 22 would be off and transistor 28 would be on. It can be seen that as to the series connected transistors 22 and 24, one such transistor is off, as is the case with series connected transistors 28 and 30. Because at least one transistor in each feedback path is off, the feedback from the output flip-flop 12 to the input flip-flop 10 is broken. Thus, the change of state on the data input 20 has no affect on the logic state appearing at nodes 32 and 34, as initially established during the slewing time of the high-speed latch.

From the foregoing, it can also be appreciated that the precharge control and the data control input to the high-speed latch can be controlled with a single signal, i.e., be synchronous in nature. This eliminates the need for a separate data input clock, as is necessary in many conventional latch circuits. This feature of the invention is highly advantageous in high-speed circuits such that a single high-speed clock can control all the latch operations. It can be appreciated that with the features and advantages of the present invention, high-speed signals do not need to be segmented or divided into other signals to provide delay periods to satisfy hold time requirements of the latches.

Other technical advantage of the invention include the option to construct input data flip-flop transistors 22 and 28 as large channel devices, without affecting the overall high-speed operation of the latch. In addition, transistors 46 and 48 can be constructed as narrow channel devices to reduce nodal capacitance, thereby optimizing the speed of the latch. Such changes in the structural features of the latch disclosed in the noted publication would adversely affect the speed and operation of such latch.

Figure 2:
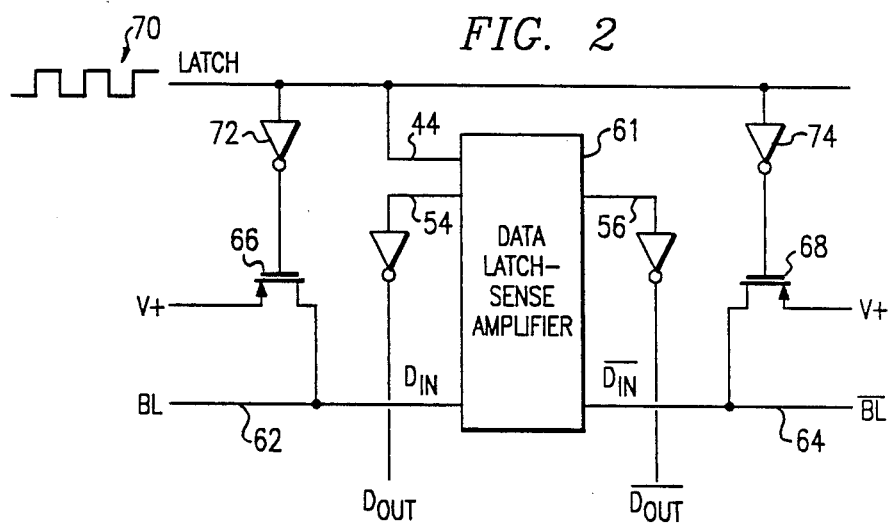
FIG. 2 is an electrical schematic drawing of an alternate embodiment of the invention well adapted for semiconductor memory applications.

The features and advantages of the latch 61 of the invention can also be realized when used in connection with a semiconductor memory. The latch 61 shown in FIG. 2 is substantially identical to that illustrated in FIG. 1. FIG. 2 illustrates a latch application utilized in connection with a memory having complementary bit lines, such as shown by numerals 62 and 64. Such bit lines carry signals from a memory cell (not shown), which signals are also complementary in nature to reduce common node noise problems. The bit lines 62 and 64 are also of the type which are precharged by respective transistors 66 and 68. The bit line precharge transistors 66 and 68 are connected to a supply voltage V+ which may typically be about one-half the magnitude of $V_{dd}$. As noted, the bit line precharge transistors 66 and 68 are controlled by the inverse of the clock signal 70. Inverters 72 and 74 function to provide the inverse of the clock signal 70.

As the sense amplifier output nodes 36 and 38 are being precharged, one memory cell associated with the bit lines 62 and 64 is being read to output data on the bit lines 62 and 64 which were previously precharged. During the rising transition of the clock signal 70, and as described above, the precharged transistor 66 is driven into conduction to precharge the bit line 62. The same action also occurs with respect to the complementary bit line 64, wherein the precharge transistor 68 is driven into conduction. On the rising edge of the clock signal, the sense amplifier 61 slews toward a stable state defined by the bit line memory signals, while at the same time the bit lines 62 and 64 undergo another precharge cycle. This synchronous operation is possible due to the exceedingly low hold time of the sense amplifier 61. Hence, data sensing and bit line precharging can begin substantially simultaneously, with precharging continuing for a full half clock cycle. It is apparent that the data on the bit lines is valid for only a few nanoseconds before being destroyed by the bit line precharging. As noted above, the advantage of this feature is that a single clock signal can control sense amplifier operation as well as bit line precharging. The technical advantage of this feature is that the memory can be run at a high-speed clock rate, without further clock dividing to generate timing signals for assuring that specified data hold time requirements are met. By utilizing the latch of the invention, a memory read operation can be fully executed in a single clock cycle.

From the foregoing, disclosed is a high-speed data latch which provides a lockout of data changes input thereto, as soon as the latch begins slewing toward a definable stable state. A cross-coupled feedback path is provided between an input and output section of the latch during such slewing time period to sustain latchup of a final logic state. However, should the input data change subsequent to the slewing of the definable logic state, the positive feedback path is broken to prevent final latchup of a different logic state. In addition to the technical advantages noted above, the provision of the inhibit circuit of the invention can be easily and efficiently integrated with current semiconductor processing techniques. Indeed, the latch circuit can be constructed by fabricating the additional transistors in the same semiconductor well as the input data section of the latch. Notwithstanding, those skilled in the art may prefer to employ the features and advantages of the invention without resorting to the particular latch construction noted above.

Therefore, while the preferred embodiment of the invention has been disclosed with reference to several specific constructions, it is to be understood that many changes in detail may be made as a matter of engineering choices without departing from the spirit and scope of the invention, as defined by the appended claims.

What is claimed is:

1. A data latch circuit, comprising:
   an input data storage section for receiving data input to said data latch circuit;
   an output data storage section prechargeable to a predetermined state;
   a transfer circuit operative during a transfer cycle for transferring data from said input data storage section to said output data storage section;
   an output for outputting data from said data latch circuit; and
   an inhibit circuit for allowing a transfer of data from said input storage section to said output storage section to change an initial precharged state thereof, but preventing a subsequent transfer of data until said output storage section is again precharged.

2. The data latch circuit of claim 1, wherein said inhibit circuit is cross-coupled between said input data storage section and said output data storage section.

3. The data latch circuit of claim 2, wherein said input and output data storage sections each comprise a flip-flop, and said inhibit circuit comprises a first transistor cross-coupled between said input and output data storage sections, a second transistor cross-coupled between said input and output data storage sections, said first and second transistors being responsive to a data state transferred to said data output section for preventing a change in said data state as a result of a change in a data state input to said input data storage section.

4. The data latch circuit of claim 3, further including a clock driver for alternately precharging said data latch circuit during one cycle and for inputting data to said data latch circuit during another cycle.

5. A data latch circuit, comprising:
an input flip-flop for inputting data into said data latch circuit, said input flip-flop having a pair of output nodes;
an output flip-flop for providing a pair of output nodes of said data latch circuit;
a precharge circuit for precharging said output nodes to a predetermined state;
a pair of transistors, each operative for transferring data between respective said nodes of said input and output flip-flops;
a first pair of series-connected transistors connected between one said node of said input flip-flop and a reference voltage, a first transistor of said first pair being driven by an input data signal and a second transistor of said pair being cross-coupled to an output node of said output flip-flop; and
a second pair of series-connected transistors connected between a different node of said input flip-flop and a reference voltage, a first transistor of said second pair being driven by a complement of said input data signal and a second transistor of said second pair being cross-coupled to a different output node of said output flip-flop.

6. The data latch circuit of claim 5, wherein said input flip-flop comprises N-channel transistors and said output flip-flop comprises P-channel transistors, and wherein said precharged circuit comprises P-channel transistors, and said transfer transistors and said first and second pair of transistors comprise N-channel transistors.

7. The data latch circuit of claim 5, further including a clock driver for alternately precharging said data latch circuit during one clock cycle and for inputting data to said data latch circuit during another clock cycle.

8. A data latch circuit, comprising:
an input flip-flop for inputting data into said latch circuit, said input flip-flop having a pair of output nodes;
an output flip-flop for providing a pair of output nodes of said data latch circuit;
a precharge circuit for precharging said output nodes of said output flip-flop to a predetermined state;
a pair of transistors, each operative for transferring data between respective said nodes of said input and output flip-flops;
a data input circuit for inputting a data signal and a complement of said data signal to said input flip-flop; and
an inhibit circuit for providing feedback of data set into said output flip-flop back to said data input circuit to prevent a subsequent change in the data signal from changing the state of the output flip-flop.

9. The data latch circuit of claim 8, wherein said data input circuit includes a first transistor responsive to data input to said input flip-flop, and said inhibit circuit comprises a second transistor in series with said first transistor, said second transistor being cross-coupled to an output node of said output flip-flop.

10. The data latch circuit of claim 9, wherein said first and second transistors are arranged so that an initial data signal input to said input flip-flop is transferred to said output flip-flop, said first and second transistors being in an identical state, and when the data signal changes one said transistor is driven to a different state so that at least one of said first or second transistors interrupts a positive feedback between said input and output flip-flop and said latch is prevented from changing state.

11. The data latch circuit of claim 8, further including in combination an analog to digital converter encapsulated to form an integrated circuit.

12. The data latch circuit of claim 8, further including in combination a digital to analog converter encapsulated to form an integrated circuit.

13. The data latch circuit if claim 8, further including in combination a memory encapsulated to form an integrated circuit.

14. A high-speed sense amplifier for use with a memory of the type having prechargeable complementary bit lines, comprising:
an output flip-flop having a pair of prechargeable output nodes providing an output of said sense amplifier;
an input flip-flop having a pair of inputs connected respectively to said complementary bit lines, and a pair of output nodes;
a pair transfer transistors each operative for transferring data from the output nodes of said input flip-flop to the precharged output nodes of said output flip-flop;
a clock signal generator having two alternating states, one state for precharging said bit lines and one state for reading said memory;
a precharge circuit for precharging the output nodes of said output flip-flop during the memory read state in which data is read from a cell of said memory onto said complementary bit lines; and
an inhibit circuit responsive to the slewing of said output flip-flop to a definable state for inhibiting a change of state thereof as a result of a change of signal states on said bit lines.

15. The sense amplifier of claim 14, wherein said output flip-flop is responsive to a transition of said clock signal for slewing toward a definable state as established in said input flip-flop, and said inhibit circuit is responsive to said output flip-flop slewing for inhibiting a change of state of said output flip-flop.

16. The sense amplifier of claim 14, wherein said output flip-flop nodes are precharged during the same clock signal state which also reads said memory.

17. The sense amplifier of claim 14, wherein said bit lines are precharged during the same state of said clock signal in which data is input to said sense amplifier.

18. The sense amplifier of claim 17, wherein said bit line precharging occurs substantially from one transition of said clock signal to a subsequent clock signal transition.

19. The sense amplifier of claim 14, wherein said sense amplifier is effective to latch data therein during a transition of said clock signal, and begin precharging said bit lines during the same clock signal transition.

20. The sense amplifier of claim 14, further including a bit line precharge circuit for precharging said bit lines in response to a clock signal which is coupled to said output flip-flop for precharging the output nodes thereof.

21. A method of driving a memory, comprising the steps of:
    clocking said memory with a signal having a pair of alternating states so that bit lines of said memory are precharged during one said state and said memory is read during the other said state;
    precharging circuits of a memory sense amplifier during the clock signal state in which said memory is also read; and
    latching data carried on said bit line as a result of said read operation into said sense amplifier during a transition of said clock signal, and during said transition also precharging the bit lines.

22. The method of claim 21, further including latching data in said sense amplifier during an initial portion of said transition and beginning said bit line precharging during a subsequent portion of said transition.

23. The method of claim 21, further including controlling all operations of said sense amplifier with a single clock signal.

24. The method of claim 23, further including precharging the sense amplifier circuits during a first state of said clock signal and inputting data thereto during a different clock signal state.

25. The method of claim 21, further including performing a read operation of said memory in which data is output therefrom in a single cycle of said clock signal.

26. A method of reducing a data hold time parameter of a latch, comprising the steps of:
    precharging an output node of said latch to a predetermined state;
    inputting data to said latch such that said precharged state slews toward a definable state; and
    disconnecting a data input to said latch so that a change of state of input data is ineffective to change the definable state of said output node.

27. The method of claim 26, further including constructing said latch as a balanced circuit having a pair of prechargeable nodes which slew toward different states, and a pair of complementary data inputs.

28. The method of claim 27, further including disconnecting each said data input after said slewing and in response to a change of input data.

29. The method of claim 26, further including constructing said latch with a data output section connected to a data input section with a feedback path therebetween, providing feedback on said path when a definable state of said output section coincides with a data state input to said input section, and disconnecting said feedback path when said definable state differs from said data state input to said input section.

30. The method of claim 29, further including constructing said feedback path with a pair of series-connected transistors with inputs connected respectively to said output section and to an input of said input section.

31. The method of claim 26, further including fabricating said latch in an integrated circuit with an analog to digital converter.

32. The method of claim 26, further including fabricating said latch in an integrated circuit with a digital to analog converter.

33. The method of claim 26, further including fabricating said latch in an integrated circuit with a semiconductor memory.

* * * * *